(12) United States Patent
Ishio et al.

(10) Patent No.: US 6,552,426 B2
(45) Date of Patent: Apr. 22, 2003

(54) SEMICONDUCTOR DEVICE AND METHOD OF MANUFACTURING SAME

(75) Inventors: Toshiya Ishio, Nabari (JP); Hiroyuki Nakanishi, Kitakatsuragi-gun (JP); Katsunobu Mori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/847,314

(22) Filed: May 3, 2001

(65) Prior Publication Data

US 2001/0040285 A1 Nov. 15, 2001

(30) Foreign Application Priority Data

May 10, 2000 (JP) ........................................ 2000-137702

(51) Int. Cl.⁷ .............................................. H01L 23/52
(52) U.S. Cl. ................... 257/692; 257/666; 257/676; 257/693; 257/737; 257/738; 257/777
(58) Field of Search ................. 257/666, 676, 257/692, 693, 737, 738, 777

(56) References Cited

U.S. PATENT DOCUMENTS

| | | | | |
|---|---|---|---|---|
| 5,739,585 A | * | 4/1998 | Akram et al. ................ 257/680 |
| 5,874,784 A | * | 2/1999 | Aoki et al. ................. 257/666 |
| 5,925,934 A | * | 7/1999 | Lim ........................... 174/52.4 |
| 5,953,592 A | * | 9/1999 | Taniguchi et al. ........... 438/118 |
| 6,049,129 A | * | 4/2000 | Yew et al. ................... 257/737 |
| 6,133,637 A | * | 10/2000 | Hikita et al. ................ 257/666 |
| 6,229,217 B1 | * | 5/2001 | Fukui et al. ................ 257/685 |
| 6,232,650 B1 | * | 5/2001 | Fujisawa et al. ............ 257/666 |
| 6,315,540 B1 | * | 11/2001 | Tsuruta ................... 264/272.14 |
| 6,331,737 B1 | * | 12/2001 | Lim et al. .................... 257/693 |
| 6,368,896 B2 | * | 4/2002 | Farnworth et al. .......... 438/113 |

FOREIGN PATENT DOCUMENTS

JP        10-223688        8/1998

* cited by examiner

Primary Examiner—Richard Elms
Assistant Examiner—Douglas Menz
(74) Attorney, Agent, or Firm—Nixon & Vanderhye, P.C.

(57) ABSTRACT

The present invention provides a quality and reliable high-density package (Chip Size Package) semiconductor device without problems related to the manufacturing process. The semiconductor device includes the first semiconductor substrate piece having electrode pads formed on its principle surface, and a second semiconductor mounting piece mounted thereon via a first insulating film and a die-attaching material. On the surface opposite the first semiconductor substrate piece of the second semiconductor substrate piece, formed are wiring patterns and a second insulating film for protecting the wiring patterns. The wiring patterns include electrode pads, wires, and lands where external connection terminals are provided.

9 Claims, 13 Drawing Sheets

F I G. 7 (a)
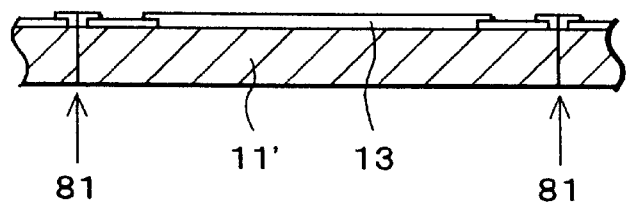
F I G. 7 (b)
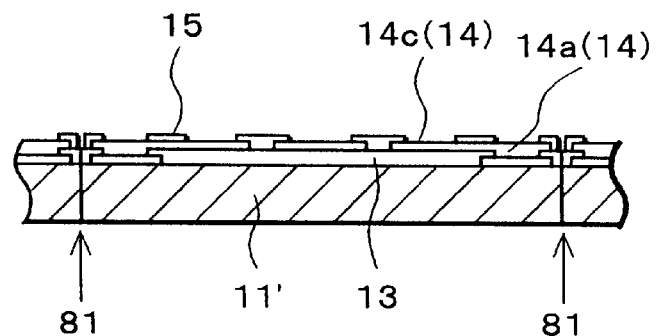
F I G. 7 (c)
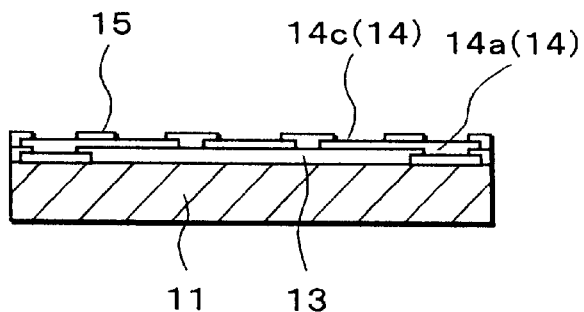

SEMICONDUCTOR DEVICE AND METHOD OF MANUFACTURING SAME

FIELD OF THE INVENTION

The present invention generally relates to a semiconductor device and a method of manufacturing same, and in particular to a miniaturized semiconductor device and a method of manufacturing same.

BACKGROUND OF THE INVENTION

In recent years, various CPS (Chip Size Package) type semiconductor devices have been proposed. These semiconductor devices of CPS type have been viewed with interest for miniaturization virtually to a chip size.

As illustrated in FIG. 12, a CSP type semiconductor device adopts a frame 101 made of resin such as polyimide having formed thereon wiring patterns. On this frame 101, a die-attaching material 102 is applied, for mounting thereon a semiconductor chip 103.

Then, after curing the die-attaching material 102 by heating, the wiring patterns (not shown) formed on the resin frame 101 and electrode pads 105 formed on the semiconductor chip 103 are electrically connected.

Next, the semiconductor chip 103 is sealed with resin sealer 106 by means of transfer molding, and an outer-curing is performed to cure the resin sealer 106. Then, after placing the resulting molded article upside down, solder balls are placed on the resin frame 101 to be subjected to reflow melting in a reflow furnace, thereby forming external electrodes 107 for receiving and outputting electric signals from and to externally connected sections. Further, the resin frame 101 is cut into semiconductor devices. In FIG. 12, a reference numeral 108 indicates an insulating film.

According to the forgoing structure, the metal wires 104 are provided outside the semiconductor chip 103, and therefore the semiconductor device needs to be larger than the size of the semiconductor chip 103.

In the foregoing conventional structure, since metal wires are arranged on the periphery of the semiconductor chip, it is not possible to miniaturize the semiconductor device to the semiconductor chip size.

In response, Japanese Unexamined Patent Publication No. 223688/1998 (Tokukaihei 10-223688 published on Aug. 21, 1998) discloses a semiconductor device of a miniaturized package to the size of a semiconductor chip. As illustrated in FIG. 13, the semiconductor device disclosed in this publication is prepared by bonding an insulating substrate 116 made of polyimide and the like, having formed thereon electrically conductive patterns 115 (interposer), onto a semiconductor chip 111 using an elastic bonding agent 117. For the elastic bonding agent 117, epoxy bonding agent is adopted. The above publication also discloses, as one example, a semiconductor wherein the semiconductor chip 111 and the electrically conductive patterns 115 are connected by wire-bonding.

The electrically conductive patterns 115 formed on the insulating substrate 116 serve as an interposer, and signals outputted from the semiconductor chip 111 are sent to external connection terminals via the electrically conductive patterns 115. The external connection terminals are formed on one end of the electrically conductive patterns 115. The electrically conductive patterns 115 are formed so as to have a width within the range of from 50 to 100 µm, and a thickness within the range of from 20 to 50 µm. In FIG. 13, a reference numeral 112 indicates an electrode of the semiconductor chip 111. A reference numeral 113 indicates wires for use in electrically connecting the semiconductor chip 111 and the electrically conductive patterns 115 by wire-bonding. A reference numeral 114 indicates an insulating film.

However, the foregoing interposer in the conventional semiconductor device as disclosed in the above publication has the following disadvantages in its manufacturing process and reliability.

Problems Related to the Manufacturing Process

① In order to attain a higher productivity, an insulating substrate made of, for example, polyimide, etc., may be bonded onto a semiconductor chip in the wafer state. In this case, however, a problem arises in that the wafer as bonded greatly warps, which leads to troubles in the subsequent transport process (for example, the manufacturing device stops operating, etc.,) or the wafer cracks, etc.

In the case of adopting the insulating substrate made of polyimide, it is possible to prevent the aforementioned warpage of the wafer by forming a slit of around 50 to 100 µm by etching. However, by doing so, it becomes difficult to bond the insulating substrate onto the semiconductor chip.

② Wires are generally formed on the insulating substrate made of polyimide by the following method. That is, first, a copper foil which has being rolled to have a thickness of 18 µm is laminated onto the insulating substrate to be affixed thereto using a bonding agent, and it is then patterned to be a shape as desired by the wet-etching. Therefore, when adopting the foregoing method, the finest possible patterning would be a patterning having land and groove widths of 20 µm, and therefore, the foregoing method is not suited for the formation of any finer wiring patterns.

③ As it is not possible to form elements, the foregoing method is not suited for multi-chip semiconductor device.

Problem Related to the Reliability

④ Due to a great difference in the linear thermal expansion coefficients between the insulating substrate made of polyimide, glass containing epoxy resin, etc., and the semiconductor chip, a heating cycle is liable to be damaged.

⑤ Epoxy, polyimide, etc., generally used as a material for the insulating substrate, absorbs water, and this leads to a poorer moisture-proofness of the semiconductor chip, or heat generated when mounting the substrate may cause the semiconductor chip separate from the insulating substrate.

⑥ The substrate made of polyimide, glass-containing epoxy resin, etc., is not light-shielding, and therefore an operation error may occur due to an incident light for some types of semiconductor chips.

SUMMARY OF THE INVENTION

It is an object of the present invention to provide a quality and reliable high-density package (CSP) semiconductor device without problems related to the manufacturing process.

In order to achieve the above object, the semiconductor device of the present invention is characterized by including:

a first semiconductor substrate piece having active elements and electrodes formed on its principal surface;

at least one semiconductor substrate mounting piece made of a same material as the first semiconductor substrate piece, the semiconductor substrate mounting piece being mounted on the principle surface side of the first semiconductor substrate piece, to be fitted within the principal surface, wiring patterns including electrodes, formed on a surface of a semiconductor substrate mounting piece in a top layer of the semiconductor substrate mounting pieces;

external connection terminals formed on the wiring patterns; and conductors for connecting the electrodes formed on the first semiconductor substrate piece and the electrodes formed on the semiconductor substrate mounting piece in the top layer.

According to the foregoing structure, the semiconductor substrate mounting piece in the top layer has the wiring patterns and external connection terminals formed on the surface thereof, which are electrically connected to the electrodes formed on the principal surface of the first semiconductor substrate piece, and the forgoing semiconductor substrate mounting piece in the top layer serves as an interposer.

Generally, for an interposer of a semiconductor device, resin-based (for example, polyimide, glass containing epoxy resin) insulating substrate is adopted. However, when adopting such resin insulating substrate as an interposer, fine wiring patterns are difficult to be formed, or a warpage of a wafer is likely to occur in the manufacturing process due to a difference in the linear thermal expansion coefficients between the insulating substrate and the semiconductor chip.

In contrast, according to the manufacturing method of the present invention, the semiconductor substrate mounting piece formed in the top layer as an interposer is made of a same material as the substrate (first semiconductor substrate piece) of the semiconductor chip. It is therefore possible to manufacture the semiconductor substrate mounting piece using the manufacturing line of semiconductor chips. As a result, fine wiring patterns can be formed. According to the structure of the present embodiment, it is also possible to form elements which could not be formed when adopting the conventional interposer made of a resin material. Furthermore, by adopting the semiconductor substrate mounting piece in the top layer made of a same material as the first semiconductor substrate, a difference in the linear thermal expansion coefficient between the first semiconductor substrate piece and the semiconductor substrate mounting piece in the top layer can be eliminated. It is therefore possible to eliminate the problem associated with a warpage of wafer due to heat applied in the manufacturing process.

Furthermore, since each mounting semiconductor substrate is arranged so as to be fitted within the size of the first semiconductor substrate piece obtained by dividing the first semiconductor substrate into pieces, such inconvenience associated with the conventional structure that conductors for connecting electrodes are provided outside the first semiconductor substrate piece can be eliminated. In the foregoing structure, the conductors may be arranged so as to connect the electrodes not only directly but also indirectly via other semiconductor substrate mounting piece.

As a result, the semiconductor device can be reduced in size to the first semiconductor substrate piece size, and in the meantime, a manufacturing cost can be reduced. Furthermore, problems related to the transportation due to a warpage of a wafer occurred in the manufacturing process, or related to the reliability in the connection by the conductors, or changes in quality due to applied heat can be prevented.

For a fuller understanding of the nature and advantages of the invention, reference should be made to the ensuing detailed description taken in conjunction with the accompanying drawings.

BRIEF DESCRIPTION OF THE DRAWINGS

FIG. 7(a) is an explanatory view illustrating one step in the manufacturing process of the semiconductor device in accordance with the second embodiment of the present invention.

FIG. 7(b) is an explanatory view illustrating one step in the manufacturing process of the semiconductor device in accordance with the second embodiment of the present invention.

FIG. 7(c) is an explanatory view illustrating one step in the manufacturing process of the semiconductor device in accordance with the second embodiment of the present invention.

DESCRIPTION OF THE EMBODIMENTS

First Embodiment

The following descriptions will discuss one embodiment of the present invention in reference to FIG. 1 to FIG. 4(b).

Figure 1:
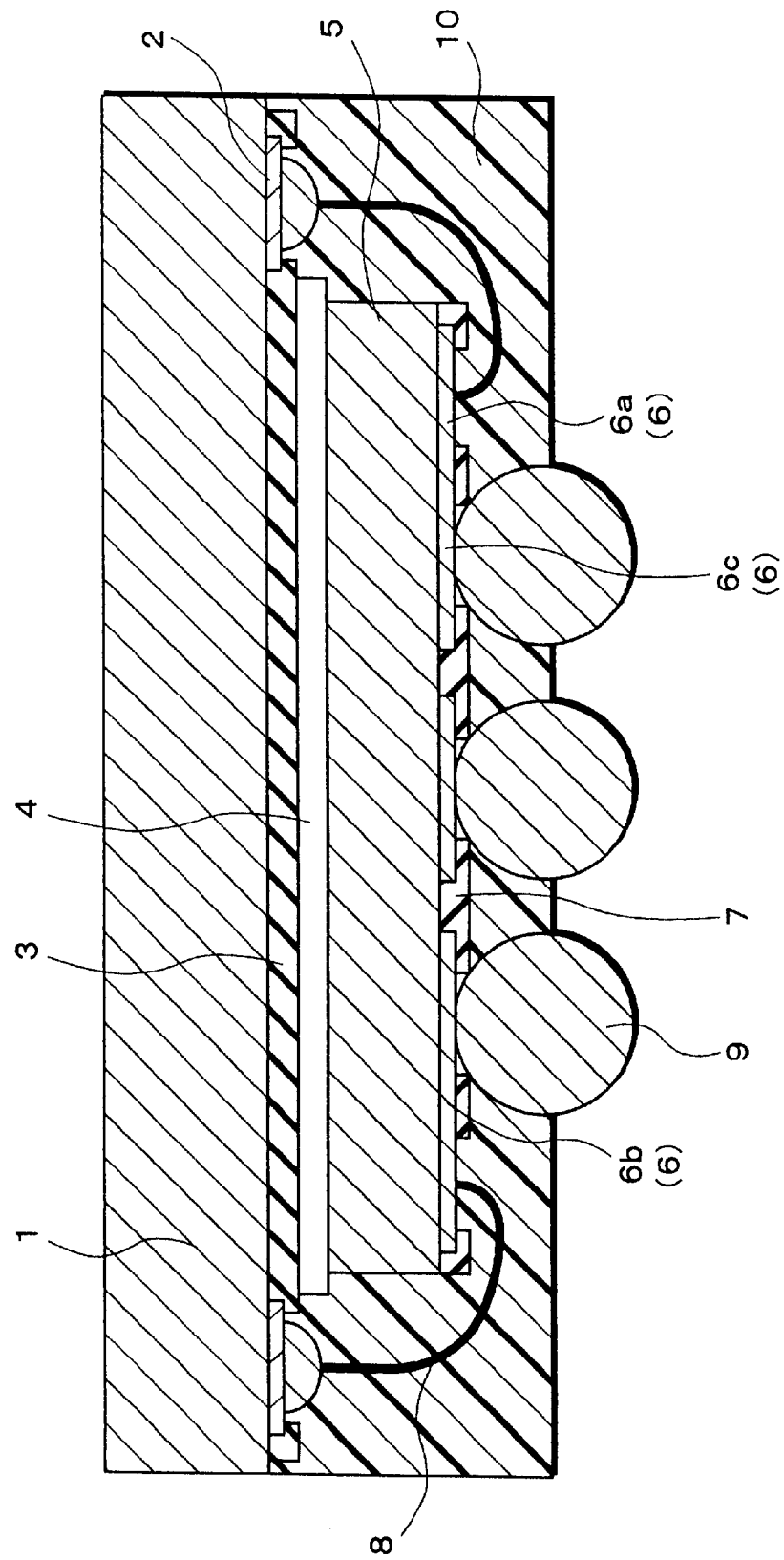
FIG. 1 is a cross-sectional view which illustrates a schematic structure of a semiconductor device in accordance with the first embodiment of the present invention.

As illustrated in FIG. 1, a semiconductor device in accordance with the present embodiment is arranged such that on a principal surface of a first semiconductor substrate piece 1, a second semiconductor substrate piece (semiconductor substrate mounting piece) 5 is mounted via a first insulating film 3 made of SiN (silicon nitride) and polyimide, and a die-attaching material 4. The above principal surface of the first semiconductor substrate piece 1 indicates a surface on the side active elements (not shown) which are elements capable of outputting electric signals, and electrode pads 2 are formed. The second semiconductor substrate piece 5 is made of a same material as the first semiconductor substrate piece 1. On the principal surface of the semiconductor substrate 5 (a surface opposite the first semiconductor substrate piece 1), formed are wiring patterns 6, and a second insulating film 7 for protecting the wiring patterns 6. The wiring patterns 6 include electrode pads (electrodes) 6a, wires 6b, and external connection terminal forming regions (lands) 6c. For the electrical connection between the electrode pads 6a of the second semiconductor substrate piece 5 and the electrode pads 2 of the first semiconductor substrate piece 1, Au wires (conductors) 8 are adopted. External connection terminals 9 are provided on the lands 6c of each wiring pattern 6. A resin sealer 10 for sealing the semiconductor device is applied so as to cover at least the Au wires 8 in a dimension of not larger than the first semiconductor substrate piece 1.

The first semiconductor substrate piece 1 is made of a plate-like cut piece of monocrystalline silicon (hereinafter simply referred to as Si). The first semiconductor substrate piece 1 is provided with active elements formed on its principal surface.

The first insulating film 3 is made of an SiN film and a polyimide film. The first insulating film 3 has openings formed around areas the electrode pads 2 are formed. The first insulating film 3 is provided for the purpose of preventing the first semiconductor substrate piece 1 from being damaged, etc.

The second semiconductor substrate piece 5 of the present embodiment is arranged such that the wiring patterns 6 made of aluminum (Al) are formed on the surface of the insulating film (not shown) such as an oxide film formed on a plate-like cut piece of monocrystalline Si. As described, the wiring patterns 6 include the electrode pads 6a, the wirings 6b, and the lands 6c (see FIGS. 4(a) and 4(b)). On the wiring patterns 6 made of Al, Nickel (Ni) (not shown) serving as a barrier metal layer and gold (Au) (not shown) to be affixed to a solder are formed by the electroless plating (electroless Au—Ni plating) on the wiring pattern 6 made of Al after applying the activation process.

The second insulating film 7 is made of polyimide film, and has openings formed in areas the electrode pads 6a and the lands 6c are formed.

For the die-attaching material 4, a sheet-like die-attaching material is adopted. For the die-attaching material, a pasted die-attaching material is also generally used. However, when adopting such pasted die-attaching material, problems are likely to occur when applying it to the first semiconductor substrate piece 1, such as the first semiconductor substrate piece 1 is damaged by an application-use needle, or the pasted die-attaching material flows into the electrode pads 2. In the present embodiment, a sheet-like die-attaching material is therefore adopted. In the case of adopting pasted die-attaching material 4, it is required to suppress variations in thickness of the first semiconductor substrate piece 1 or to form the first insulating film 3 thick, and in the meantime required to adjust the distance from the pasted die-attaching material application position to the electrode pads 12 to be an appropriate distance.

For the external connection terminals 9, a solder which contains 63 percent of Sn and 37 percent of Pb are adopted.

For the resin sealer 10, liquid form resin is adopted. It is required for the resin sealer 10 to cover at least the Au wires 8. In the present embodiment, the resin sealer 10 is provided so as to cover all of the Au wires 8, the second semiconductor substrate piece 5, the electrode pads 2 and the principle surface of the first semiconductor substrate piece 1. By adopting liquid form resin for the resin sealer 10, molds for sealing resin can be omitted, and it becomes applicable to semiconductor chips of various sizes. Further, in order to suppress generation of photoelectromotive force, it may be arranged so as to cover the back surface of the first semiconductor substrate piece 1 (the surface opposite the principle surface).

Next, a method of manufacturing a semiconductor device in accordance with the present embodiment will be explained with reference to FIG. 3(a) to FIG. 3(k). For convenience in the explanation, semiconductor substrates before dicing which are to be formed into the first semiconductor substrate piece 1 and the second semiconductor substrate piece 5 are referred to as the first semiconductor substrate 1' and the second semiconductor substrate (mounting semiconductor substrate) 5' respectively.

Figure 3A:
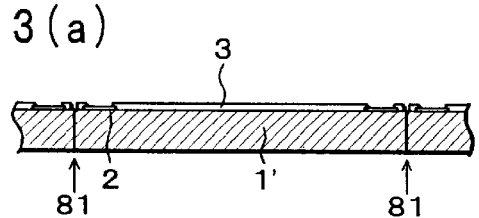
FIG. 3(a) is an explanatory view illustrating one step in the manufacturing process of the semiconductor device of FIG. 1.

In the first step, on the first semiconductor substrate 1' having electrode pads 2 and active elements (not shown) formed on the Si wafer, formed, in other regions than the areas the electrode pads 2 are formed, is the first insulating film 3 (see FIG. 3(a)). In FIG. 3(a), a reference numeral 81 indicates a scribe line.

Figure 3B:
FIG. 3(b) is an explanatory view illustrating one step in the manufacturing process of the semiconductor device of FIG. 1.

In the second step, in order to form the wiring patterns 6 on the second semiconductor substrate 5', a Si wafer without treatment is prepared, and an oxide film (not shown) is formed as an insulating film (see FIG. 3(b)).

Next, after depositing Al, a resist is subjected to spin-coating, and is then developed so as to form wiring patterns 6 in a shape as desired by etching. Then, after forming the wiring patterns 6, all the resist is separated, and is then subjected to plating with electroless Ni and electroless Au. Next, the polyimide film is subjected to spin-coating, and openings are formed on the scribe lines 81 in areas the electrode pads 6a and the lands 6c of the wiring patterns 6 are formed, thereby forming the second insulating film 7. The foregoing second insulating film 7 can be obtained by an inorganic material such as SiN film etc., or a combined use of inorganic material and an organic material such as polyimide, etc. (see FIG. 3(c)).

Next, before the dicing process, on the back surface of the Si wafer (second semiconductor device 5') whereon the wiring patterns 6 are formed, and the active elements are not formed, a sheet-like die-attaching material 4 is applied. Thereafter, on the die-attaching material 4 formed on the back surface of the second semiconductor substrate 5', a dicing sheet is bonded, and the Si wafer is then cut along the scribe lines 81 into pieces (second semiconductor substrate piece 5) (see FIG. 3(d)).

Figure 3C:
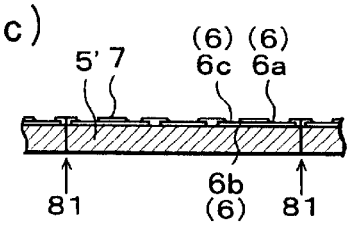
FIG. 3(c) is an explanatory view illustrating one step in the manufacturing process of the semiconductor device of FIG. 1.
Figure 3D:
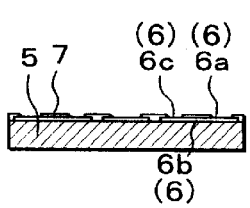
FIG. 3(d) is an explanatory view illustrating one step in the manufacturing process of the semiconductor device of FIG. 1.
Figure 3E:
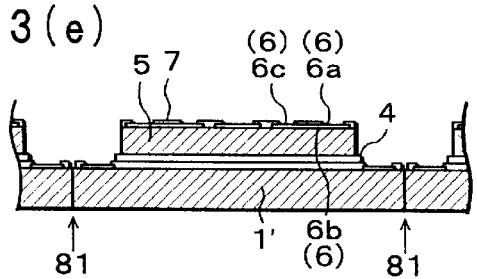
FIG. 3(e) is an explanatory view illustrating one step in the manufacturing process of the semiconductor device of FIG. 1.

Next, in the third step, the second semiconductor substrate piece 5 is mounted on the first semiconductor substrate 1' prepared in the foregoing first step in an area surrounded by the scribe lines 81, so as not to be overlapped with the electrode pads 2 (see FIG. 3(e)) The second semiconductor substrate piece 5 is mounted using the die-attaching material 4 formed on the back surface by affixing it to the predetermined region in the first semiconductor substrate 1' while heating at around 200° C. Then, the die-attaching material 4 is cured for one hour at 180° C. in an oven, so that the second semiconductor substrate piece 5 can be surely mounted on the first semiconductor substrate 1'. In the foregoing preferred embodiment, a sheet-like die-attaching material 4 is adopted; however, generally used pasted die-attaching material may be adopted. In this case, it is possible to mount the second semiconductor substrate piece 5 after applying the pasted die-attaching material in the predetermined area in the first semiconductor substrate 1', and then, cure the die-attaching material.

Figure 3F:
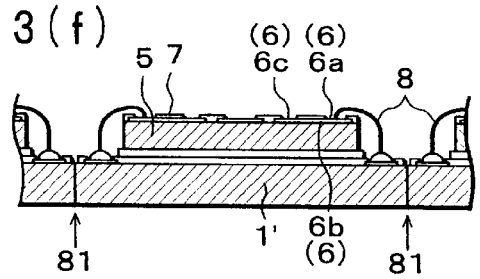
FIG. 3(f) is an explanatory view illustrating one step in the manufacturing process of the semiconductor device of FIG. 1.

In the subsequent fourth step, using the Au wires 8, the electrode pads 2 on the first semiconductor substrate 1' and the electrode pads 6a on the second semiconductor substrate piece 5 are electrically connected by wire-bonding (see FIG. 3(f)). This wire bonding is performed using ultrasonic wave at temperature around 250° C.

Figure 3G:
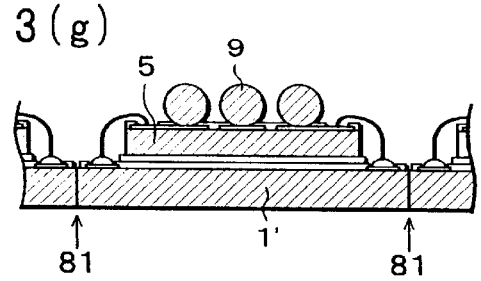
FIG. 3(g) is an explanatory view illustrating one step in the manufacturing process of the semiconductor device of FIG. 1.
Figure 3H:
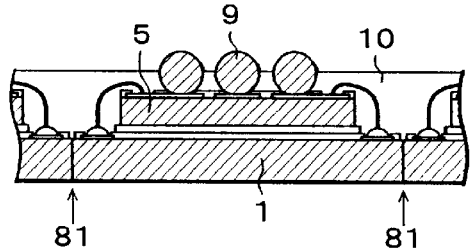
FIG. 3(h) is an explanatory view illustrating one step in the manufacturing process of the semiconductor device of FIG. 1.

In the fifth step, spheroidal shaped solder balls having formed thereon a solder material (Sn:Pb=63:37) are mounted in the lands 6c, and is then melted at 240° C. in a reflow furnace in which nitrogen atmosphere can be maintained, thereby forming external connection terminals 9 (see FIG. 3(g)).

In the sixth step, silica filler containing epoxy resin is applied by plotting so as to cover at least the Au wires 8. In the present embodiment, the resin is applied so as to cover not only the Au wires 8 but also the second semiconductor substrate piece 5 and the principal surface of the first semiconductor substrate 1' on the side the active elements are formed. The above resin is not applied to the scribe lines 81 formed in a vicinity of the periphery of the first semiconductor substrate 1' (Si wafer) so that the lines 81 can be recognized when dicing in the subsequent dicing process. Thereafter, the resin is subjected to heating for curing for one hour at 150° C., thereby forming a resin sealer 10 (see FIG. 3(h)).

Although it is not adopted in the first embodiment, the foregoing semiconductor device of the present embodiment may be further arranged so as to seal also the back surface of the first semiconductor substrate piece 1 (surface opposite the principal surface) for the purpose of suppressing generation of photoelectromotive force. As a result, an improved reliability can be achieved.

Figure 3I:
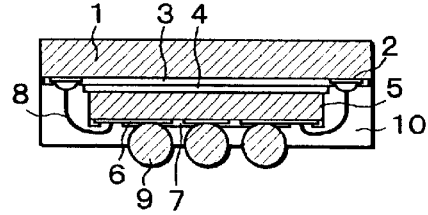
FIG. 3(i) is an explanatory view illustrating one step in the manufacturing process of the semiconductor device of FIG. 1.
Figure 3J:
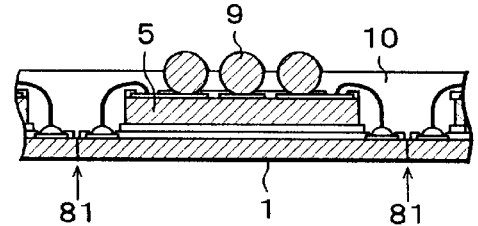
FIG. 3(j) is an explanatory view illustrating one step in the manufacturing process of the semiconductor device of FIG. 2.
Figure 3K:
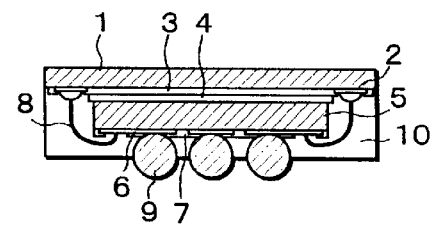
FIG. 3(k) is an explanatory view illustrating one step in the manufacturing process of the semiconductor device of FIG. 2.
Figure 4A:
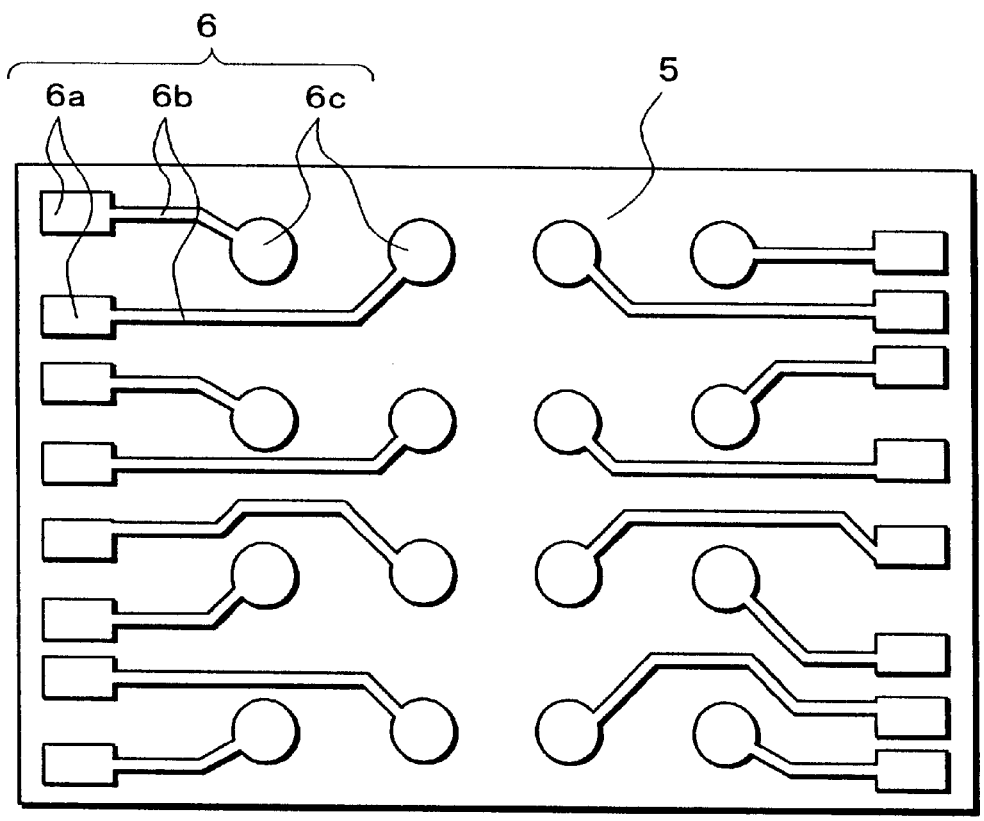
FIG. 4(a) is a plan view illustrating wiring patterns formed on a semiconductor substrate piece in accordance with the second embodiment of the present invention.
Figure 4B:
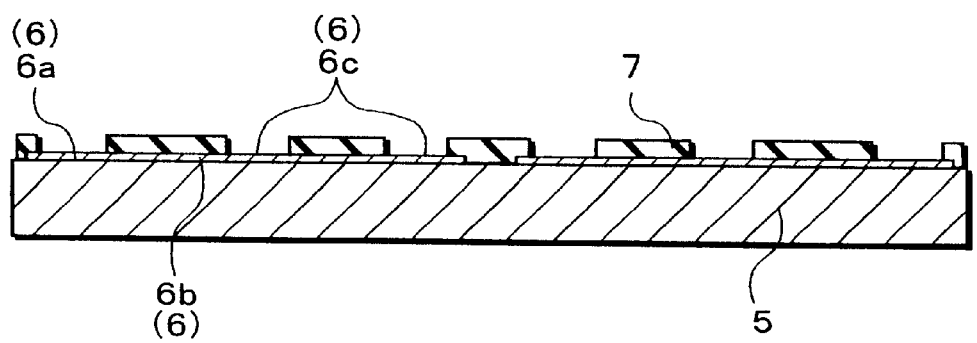
FIG. 4(b) is a cross-sectional view illustrating the wiring patterns formed on the semiconductor substrate piece of FIG. 4(a).

Lastly, in the seventh step, the first semiconductor substrate 1' is subjected to dicing, thereby completing a semiconductor device (see FIG. 3(i)).

Figure 2:
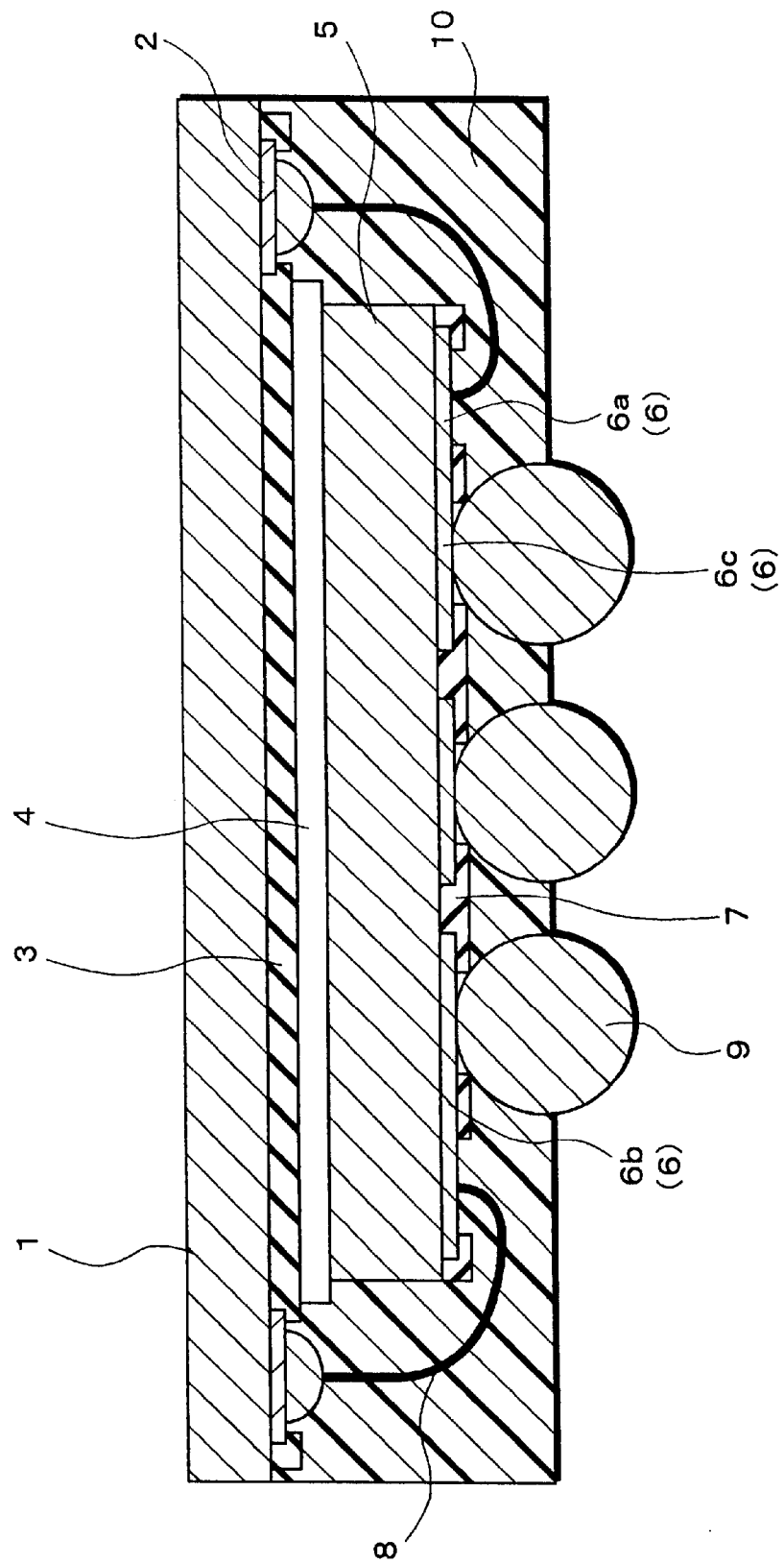
FIG. 2 is a cross-sectional view which illustrates a schematic structure of a semiconductor device as one modified example of the semiconductor device of FIG. 1.

By the foregoing method, the semiconductor device in accordance with the present embodiment illustrated in FIG. 1 can be formed. A semiconductor device having the same structure as that of FIG. 1 but has a thinner first semiconductor substrate piece 1 is illustrated in FIG. 2 as a modified example. Such semiconductor device with a thinner first semiconductor substrate piece 1 can be manufactured, for example, by polishing the back surface of the first semiconductor substrate 1' (see FIG. 3(j)) after carrying out the seventh step illustrated in FIG. 3(h). The foregoing method is preferable because if the first semiconductor substrate 1' is made extremely thinner in the first step illustrated in FIG. 3(a), such problems that the first semiconductor substrate 1' cracks in the subsequent process are very likely to occur. Then, after having gone through the subsequent dicing process, the semiconductor device as illustrated in FIG. 2 can be obtained (see FIG. 3(k)).

As described, by adopting the thinner first semiconductor substrate piece 1, an increase in height of the second semiconductor substrate piece 5 can be suppressed. According to the structure of the present embodiment, the back surface of the first semiconductor substrate piece 1 is not covered with the resin sealer, it is therefore possible to adopt a thinner first semiconductor substrate piece 1, for example, by polishing the back surface of the first semiconductor substrate piece 1 after the sealing process.

As described, according to the semiconductor device of the present embodiment, the second semiconductor substrate piece 5 which functions as an interposer is made of the same material as the substrate for the semiconductor chip (first semiconductor substrate piece 1). Therefore, the second semiconductor substrate piece 5 can be manufactured using the manufacturing line of the semiconductor chips. It is therefore possible to form fine wiring pattern. According to the structure of the present embodiment, it is also possible to form elements which could not have been formed when adopting the conventional interposer made of resin material. Furthermore, by adopting the first semiconductor substrate piece 1 and the second semiconductor substrate piece 5 of the same material, the difference in the linear thermal expansion coefficient between the first semiconductor substrate piece 1 and the second semiconductor substrate piece 5 can be eliminated. Therefore, the problem of warpage of a wafer due to heat applied in the manufacturing process can be eliminated.

Further, by adopting an interposer made of an inorganic material such as silicon (Si) which is generally used for a substrate of a semiconductor chip, adverse effect due to the absorption of water can be suppressed, and are then therefore possible to ensure the light shielding property.

Furthermore, by mounting the second semiconductor substrate piece 5 to be fitted within the size of the first piece semiconductor substrate 1, such inconvenience that the Au wires 8 are formed outside the first semiconductor substrate piece 1 can be eliminated.

As a result, the semiconductor device can be reduced in size to the size of the first semiconductor substrate piece 1, and in the meantime, the manufacturing cost can be reduced. Furthermore, problems related to the transportation due to a warpage of a wafer occurred in the manufacturing process, or related to the reliability in the connection by the conductors, or changes in quality due to applied heat can be prevented.

Second Embodiment

The following descriptions will discuss another embodiment of the present invention in reference to FIGS. 5 through 8(b). For ease of explanation, members (structures) having the same functions as those shown in the drawings pertaining to the first embodiment above will be given the same reference symbols, and explanation thereof will be omitted here.

Figure 5:
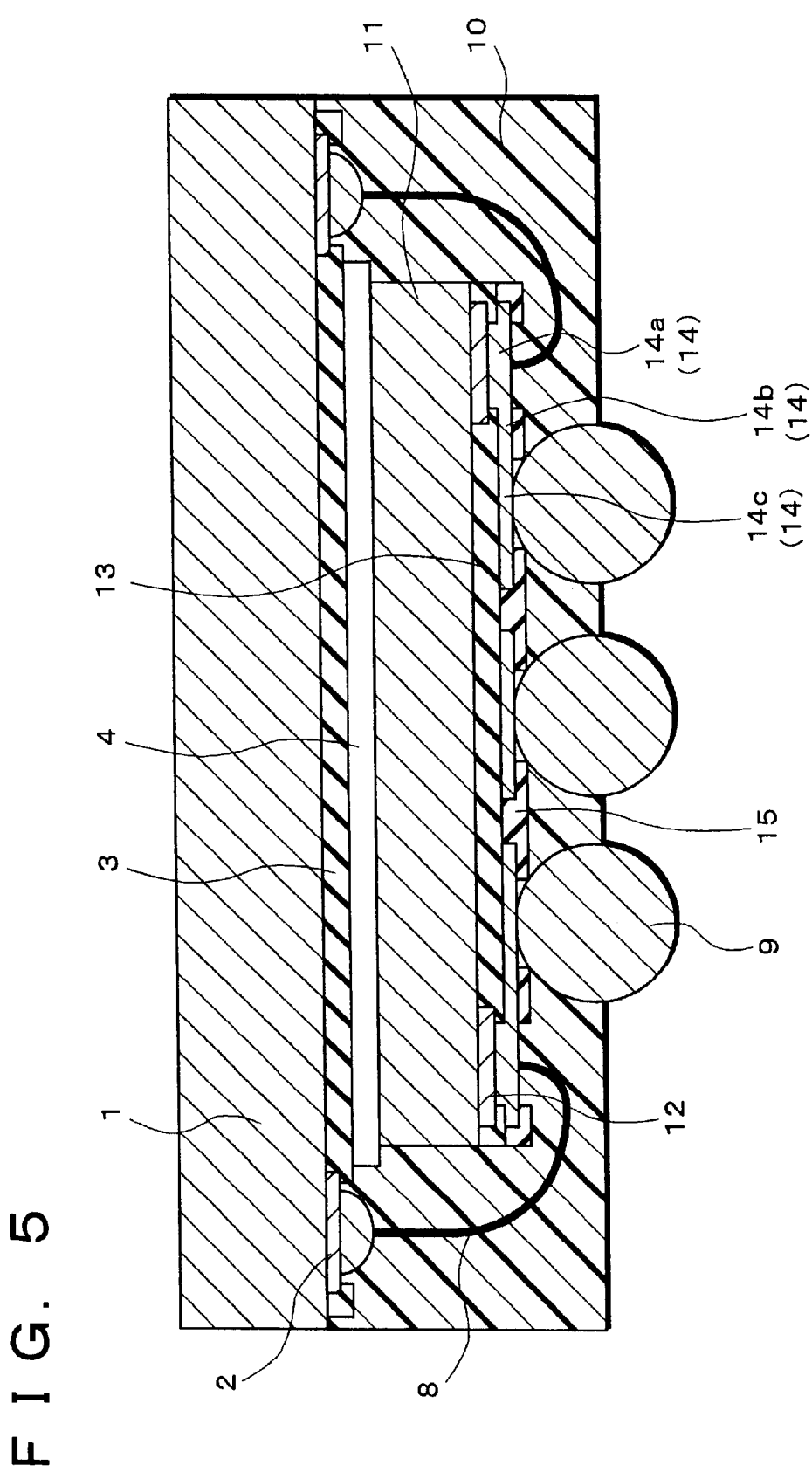
FIG. 5 is a cross-sectional view which illustrates a schematic structure of a semiconductor device in accordance with the second embodiment of the present invention.

FIG. 5 is a cross-sectional view which illustrates a schematic structure of a semiconductor device in accordance with the present embodiment. The semiconductor device in accordance with the present embodiment has the same structure as the semiconductor device of the first embodiment except that in replace of the second semiconductor substrate piece 5 without having formed thereon active elements, a second semiconductor substrate piece 11 having formed thereon the active elements is adopted.

As in the first semiconductor substrate piece 1 of the first embodiment, the second semiconductor substrate piece 11 includes active elements formed on a plate-like cut piece of monocrystalline silicone, and electrode pads 12. On the surface (principal surface) of the second semiconductor substrate piece 11 on the side the electrode pads 12 are formed, a third insulating film 13 made of SiN and polyimide is formed. The third insulating film 13 has openings formed in areas the electrode pads 12 are formed. The third insulating film 13 is provided for the purpose of preventing the second semiconductor substrate piece 11 from being damaged, etc.

Figure 8A:
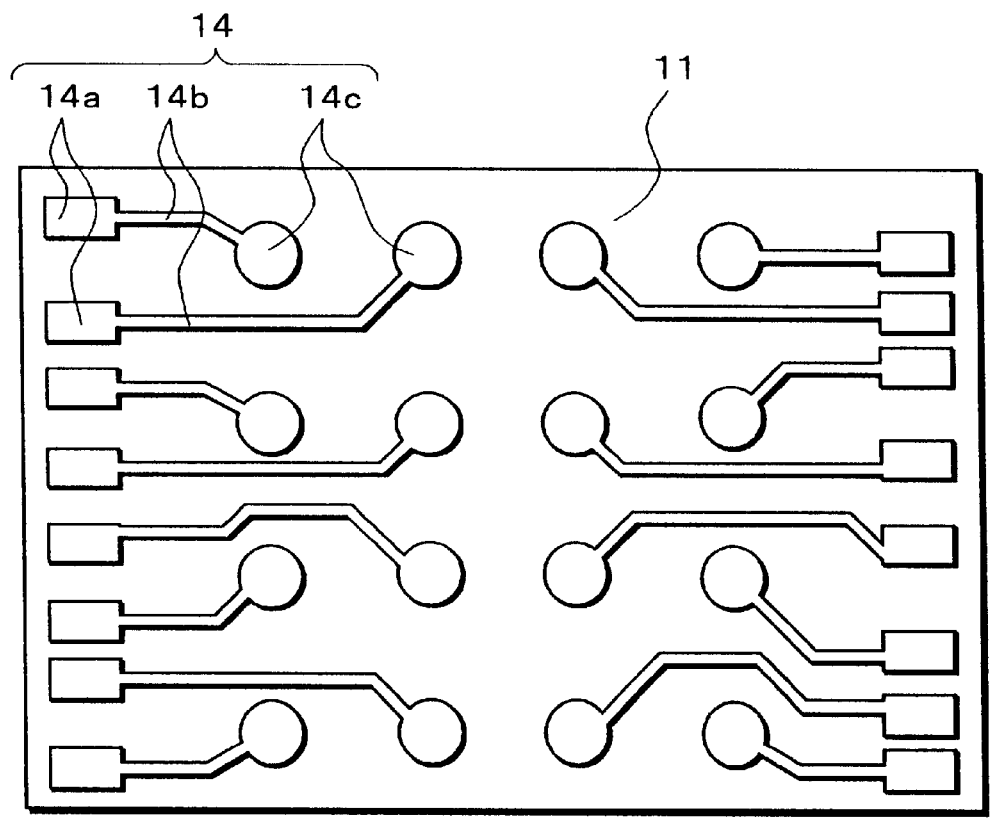
FIG. 8(a) is a plan view illustrating wiring patterns formed on a semiconductor substrate piece in accordance with the second embodiment of the present invention.
Figure 8B:
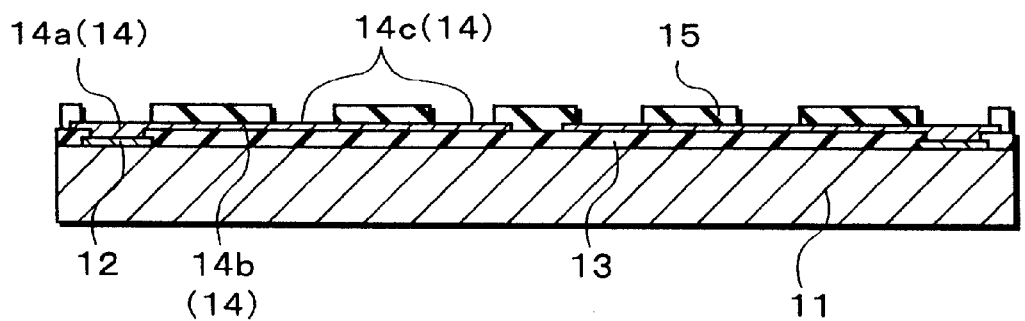
FIG. 8(b) is a cross-sectional view illustrating the wiring patterns formed on the semiconductor substrate piece of the semiconductor device of FIG. 8(a).

On the insulating substrate 13, wiring patterns 14 are formed which include electrode pads (electrodes) 14a, external connection terminal forming regions (lands) 14c, and wirings 14b (wiring sections) for electrically connecting the electrode pads 14a and the lands 14c (see FIGS. 8(a) and 8(b)).

Further, a fourth insulating film 15 is formed on the wiring patterns 14. The fourth insulating film 15 is made of a polyimide film, and has openings formed in areas the electrode pads 14a and the lands 14c are formed (see FIG. 8(a) and FIG. 8(b)).

Generally, electrodes formed on the semiconductor chip are provided in the periphery portion of the semiconductor chip. In the present embodiment, however, the electrodes are provided both in the periphery portion (electrode pads 12, 14a) and the central portion (lands 14c) of the semiconductor chip. In the present embodiment, Al is adopted for the surface of the electrode pads 12, and the wiring patterns 14 are formed by copper-plating (For the base of the wiring patterns 14, a Cu/TiW film is formed by sputtering, and for the surface of the Cu-plating is formed by an electroless Ni plating and an electroless Au plating).

In the present embodiment, the third insulating film 13 made of SiN and polyimide is adopted. However, a third insulating film 13 made of other material may be adopted as well. Similarly, other material may be adopted for the wiring patterns 14.

Next, the method of manufacturing a semiconductor device in accordance with the present embodiment will be explained with reference to FIGS. 7(a) to 7(c).

The manufacturing method of the semiconductor device in the present embodiment is the same as the method adopted in the first embodiment, expect for the steps illustrated in FIG. 7(a) through FIG. 7(c) corresponding to FIG. 3(b) through FIG. 3(d) of the method of the first embodiment. Therefore, the processes as illustrated in FIG. 7(a) through FIG. 7(c) of the present embodiment are adopted in replace of the processes illustrated in FIGS. 3(b) through 3(d) of the first embodiment. In the present embodiment, for convenience in explanation, each semiconductor substrate before dicing, to be formed into the second semiconductor substrate piece 11 (semiconductor substrate mounting piece) is referred to as a second semiconductor substrate 11'.

First, a first semiconductor substrate 1' is formed by carrying out the first step in the manufacturing method of the first embodiment.

In the second step to be performed parallel to the foregoing first step, a second semiconductor substrate 11' having active elements (not shown) formed on an Si wafer is prepared, and further a third insulating film 13 is formed on the active elements of the second semiconductor substrate 11' by a passivation film (SiN) and a polyimide film (see FIG. 7(a)).

Next, on the third insulating film 13 and electrode pads 12 made of Al, a TiW film and a Cu film are laminated by sputtering in this order. Then, the resist is subjected to the spin-coating to form openings so that the wiring patterns can be formed in a shape as desired, and the openings are then subjected to Cu-plating. Thereafter, all the resist is separated, and a film (TiW film, Cu film) formed by sputtering is subjected to etching using the Cu-plating as a mask, and a thin film (TiW film, Cu film) in other region than the wiring patterns forming region is then removed. Thereafter, the surface plated with Cu is activated, and is then subjected to the electroless Ni plating and the electroless Au plating. Next, the polyimide film is formed as the fourth insulating film 15 by the spin-coating method, and openings are formed in a vicinity of the scribe lines 81, and in the areas the electrode pads 14a and the land 14c are formed (see FIG. 7(b)).

Next, a sheet-like die-attaching material 4 is bonded to the back surface of Si wafer, i.e., the second semiconductor substrate 11' (a surface opposite the principle surface), and further, a dicing sheet is bonded onto the die-attaching material 4. Then, the second semiconductor substrate 11' is cut into pieces along the scribe lines 81, thereby forming a second semiconductor substrate piece 11 (see FIG. 7(c)).

For the subsequent steps of the foregoing manufacturing method of the present embodiment, the third to seventh steps in the aforementioned manufacturing method of the first embodiment are to be performed.

Figure 6:
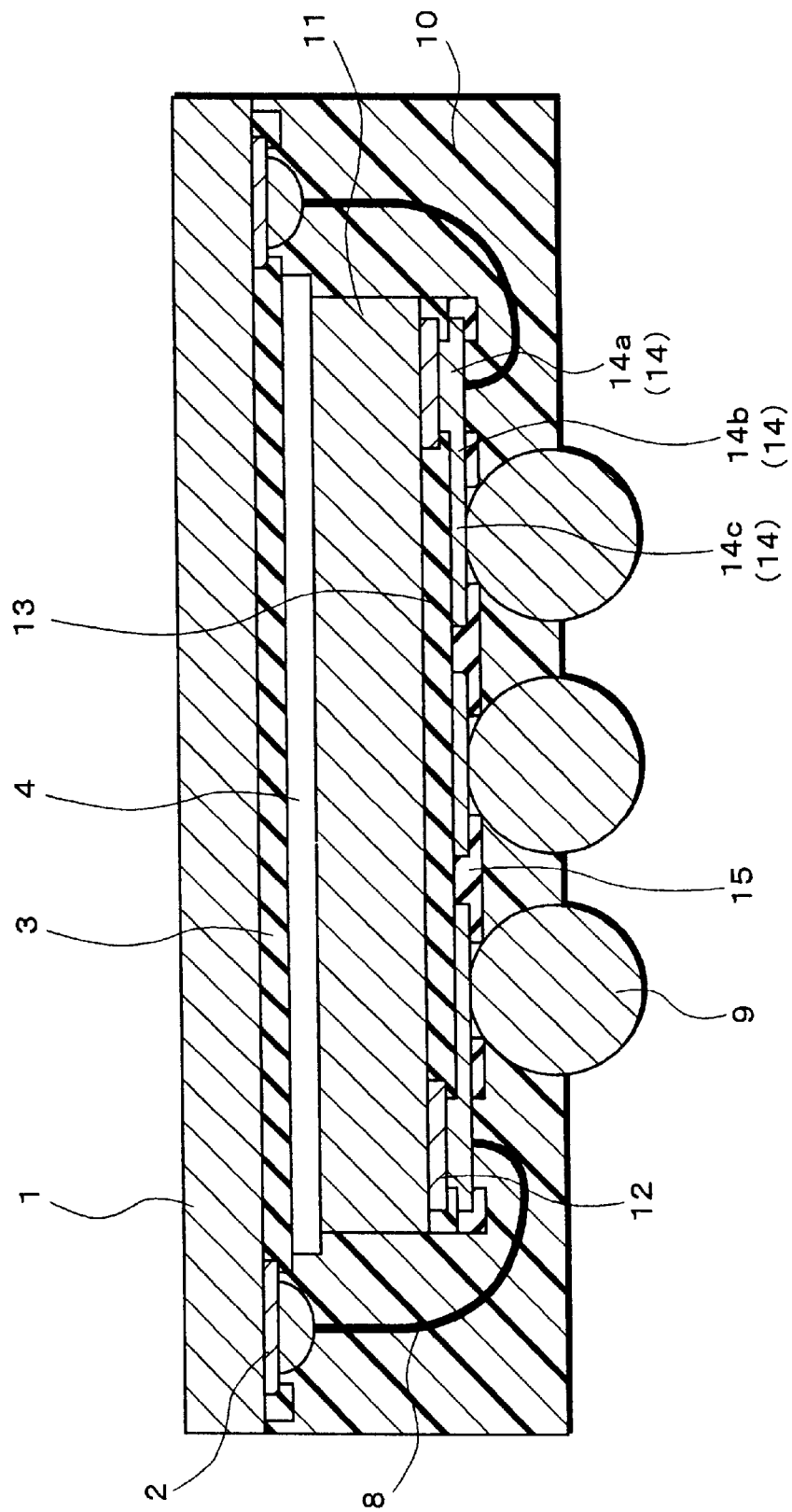
FIG. 6 is a cross-sectional view which illustrates a schematic structure of a semiconductor device as one modified example of the semiconductor device of FIG. 5.

By the foregoing method, the semiconductor device in accordance with the present embodiment illustrated in FIG. 5 can be formed. A semiconductor device having the same structure as that of FIG. 5 but has a thinner first semiconductor substrate piece 1 is illustrated in FIG. 6 as a modified example. Such semiconductor device with a thinner first semiconductor substrate piece 1 can be manufactured, for example, by polishing the back surface of the first semiconductor substrate 1 before dicing the first semiconductor substrate piece 1 as in the manufacturing method of the semiconductor device illustrated in FIG. 2 of the first embodiment. The foregoing method is preferable for the reasons explained in the first embodiment.

As described, according to the semiconductor device of the present embodiment, the active elements are provided also on the surface of the second semiconductor substrate piece 11 on the side the electrodes 12 are formed. This means that there exists a semiconductor substrate piece provided with the active elements other than the first semiconductor substrate piece within one package. Namely, the foregoing structure offers a semiconductor device of multichip one-package wherein two semiconductor chips are provided within one package. According to the structure of the present embodiment, it is possible to form the active elements on the second semiconductor substrate piece 11 by adopting the same material as the substrate (first semiconductor substrate piece) of the semiconductor chip for the semiconductor substrate 11 instead of using a resin material. Furthermore, the semiconductor device of the present embodiment is formed in the size of the first semiconductor substrate piece 1.

As a result, a smaller multi-chip one-package semiconductor device than the conventional semiconductor device can be achieved.

Third Embodiment

Figure 9:
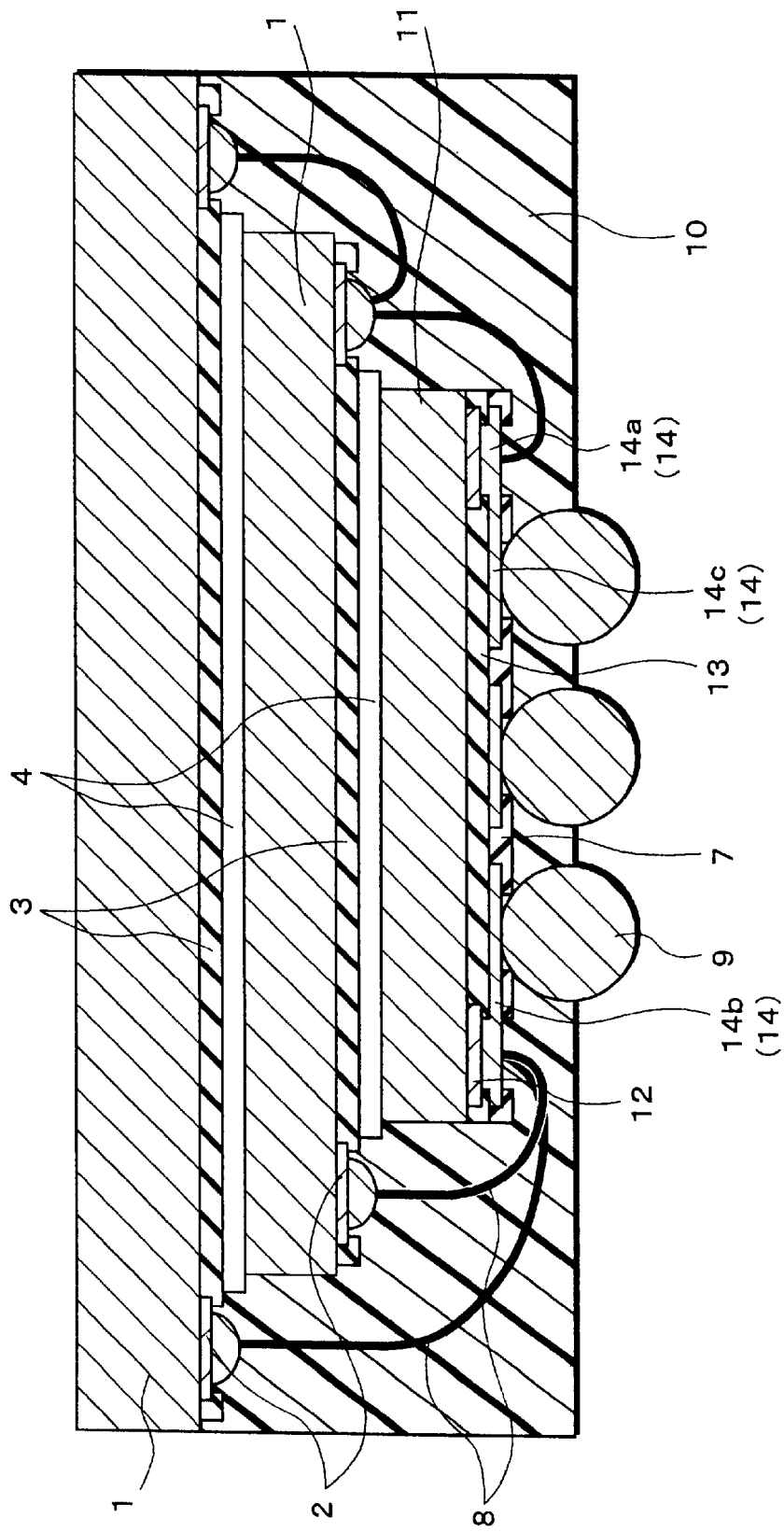
FIG. 9 is a cross-sectional view which illustrates a schematic structure of a semiconductor device in accordance with the third embodiment of the present invention.
Figure 10:
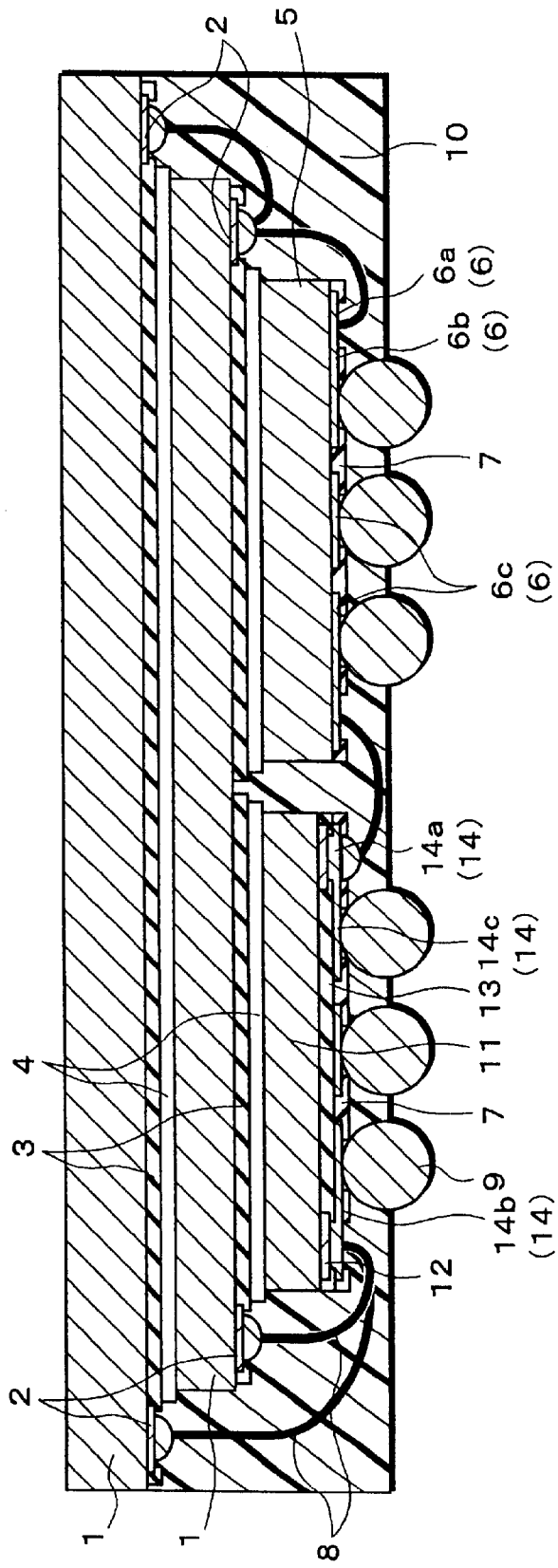
FIG. 10 is a cross-sectional view which illustrates a schematic structure of a semiconductor device as one modified example of the semiconductor device of FIG. 9.
Figure 11:
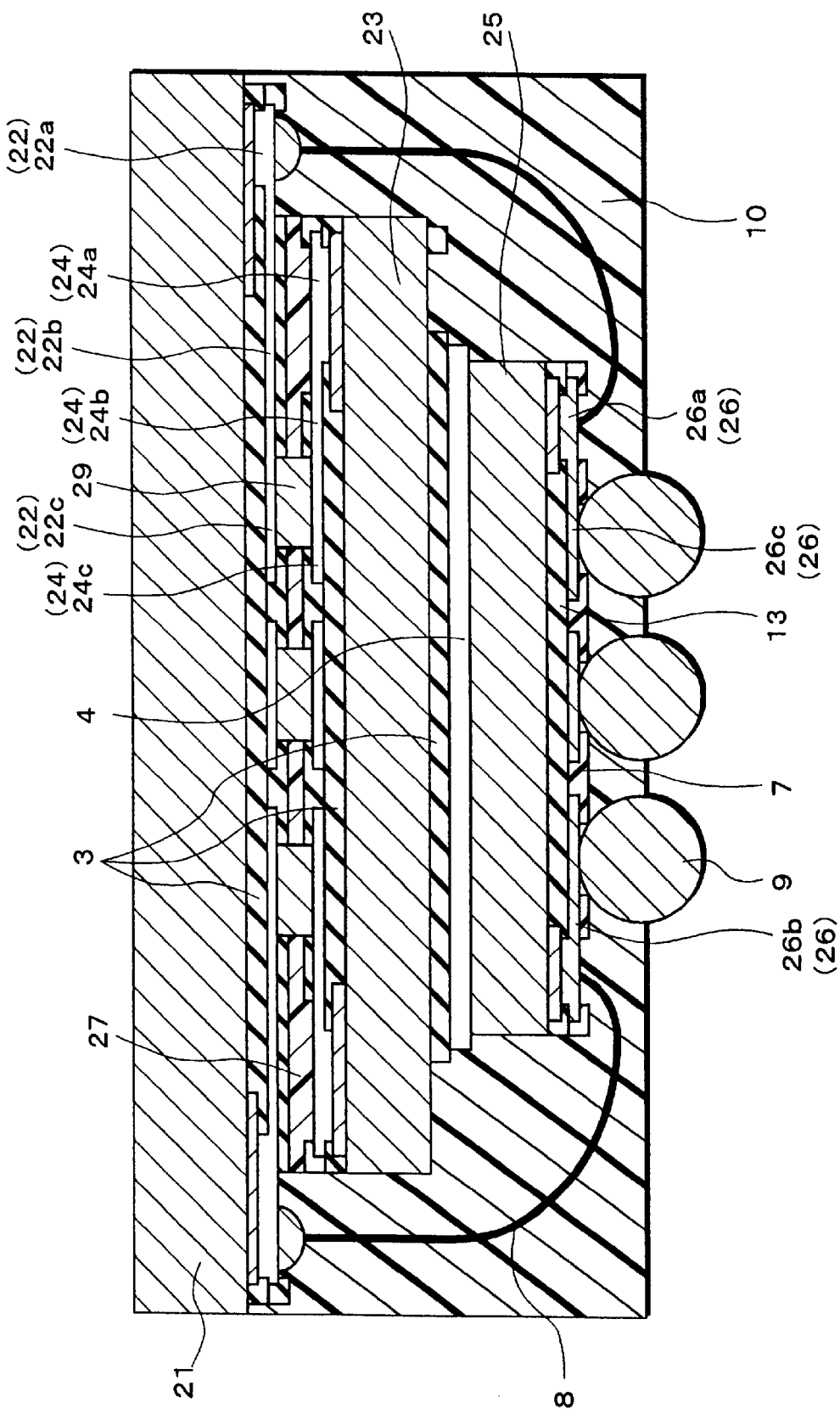
FIG. 11 is a cross-sectional view which illustrates a schematic structure of a semiconductor device as another modified example of the semiconductor device of FIG. 9.
Figure 12:
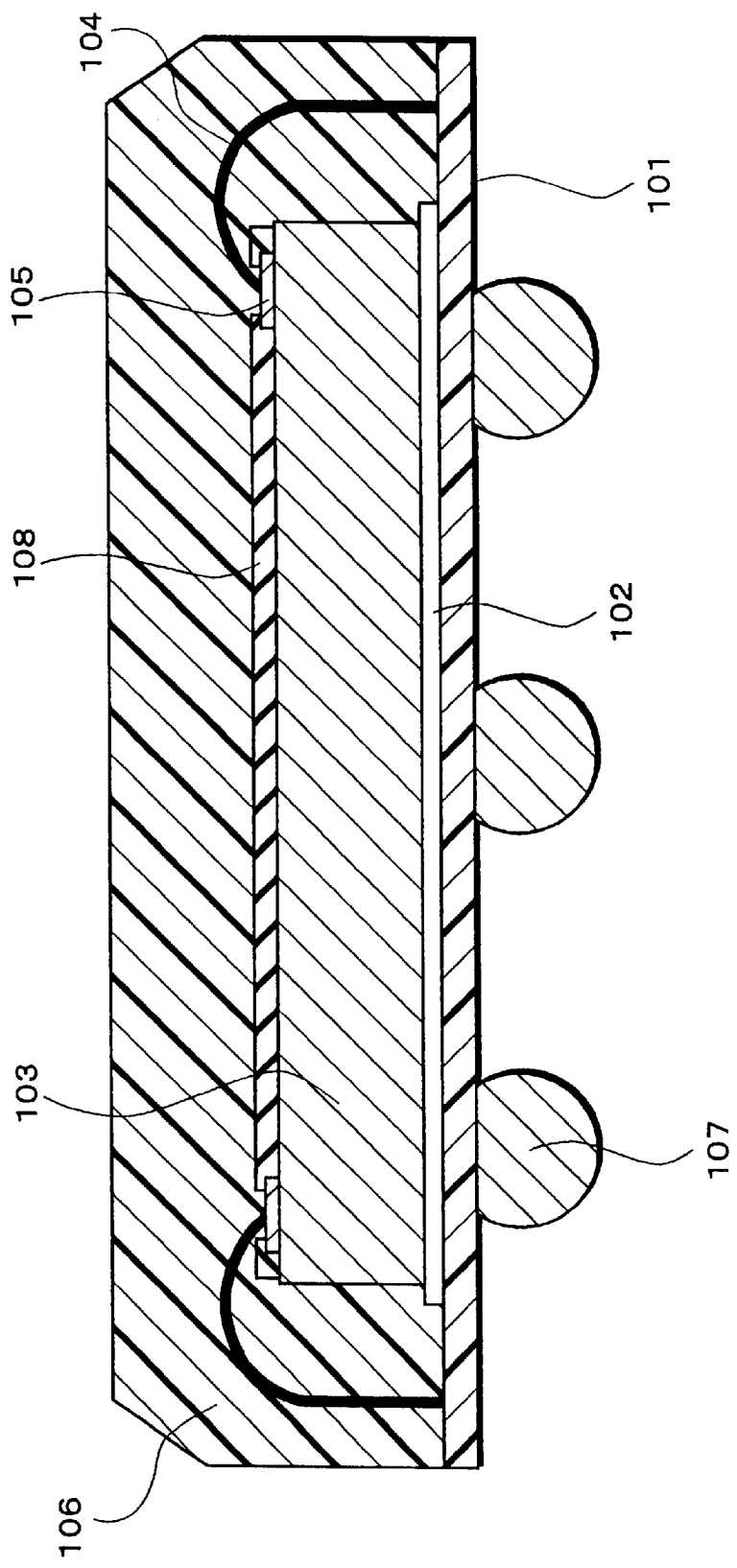
FIG. 12 is a cross-sectional view which illustrates a schematic structure of a conventional semiconductor device.
Figure 13:
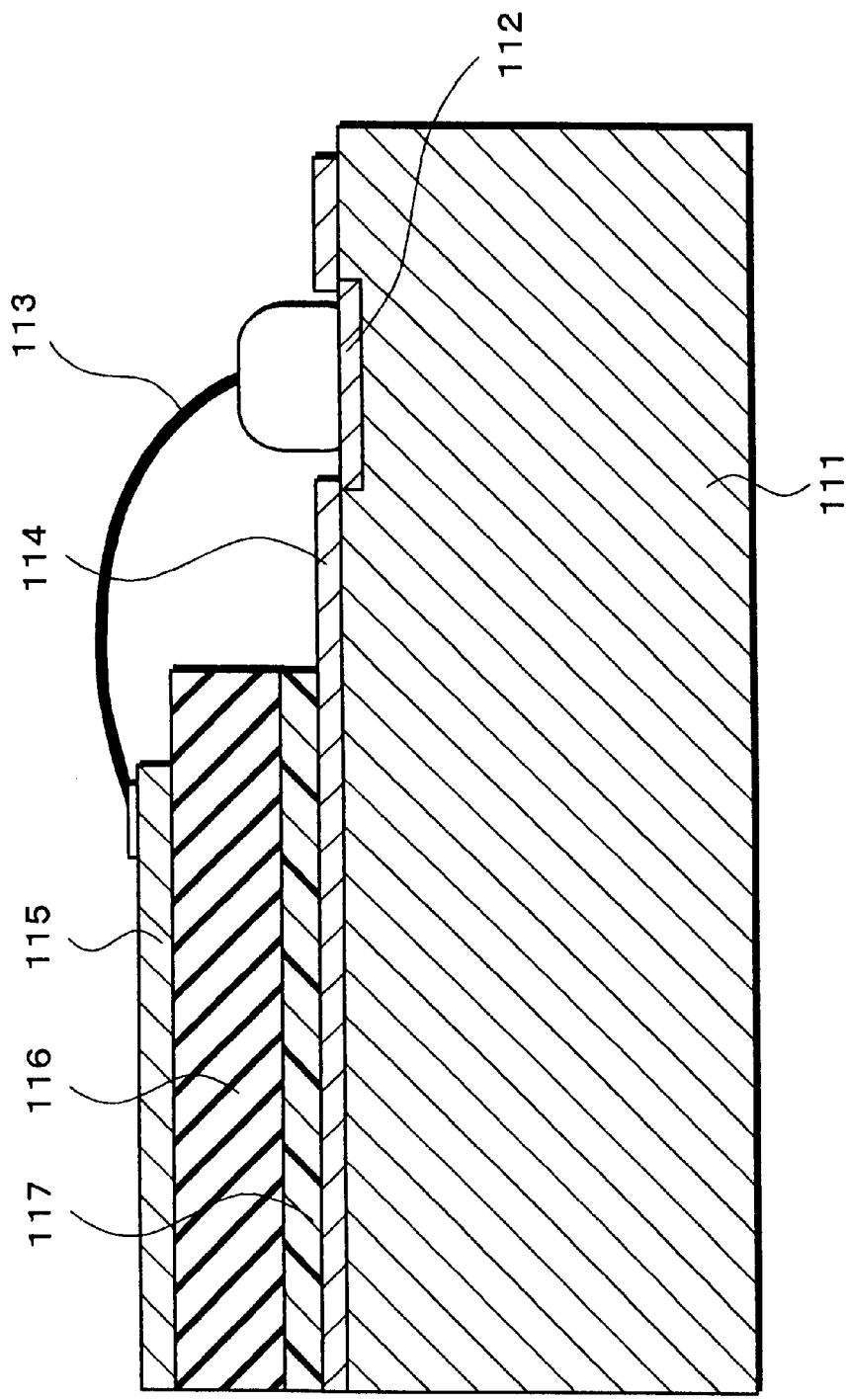
FIG. 13 is a cross-sectional view which illustrates a schematic structure of another conventional semiconductor device.

The following descriptions will discuss still another embodiment of the present invention in reference to FIGS. 9 through 11. For ease of explanation, members (structures) having the same functions as those shown in the drawings pertaining to the first and second embodiments above will be given the same reference symbols, and explanation thereof will be omitted here.

In the first and second embodiments, explanations have been given through the case of the semiconductor devices having two pieces of semiconductor substrate mounted within one package. However, the present invention is also applicable to the case of mounting three or more semiconductor substrate pieces within one package. In the present embodiment, explanations will therefore be given through the case of the semiconductor device having three or more semiconductor substrates mounted within one package.

For the semiconductor device having three or more pieces of semiconductor devices in one package, for example, the structure of laminating three pieces of semiconductor substrate as illustrated in FIG. 9, or the structure of mounting four pieces of semiconductor substrate wherein on the laminated structure of two semiconductor substrate pieces, two semiconductor substrate pieces (second semiconductor substrate piece 5 without having formed thereon active elements and the second semiconductor substrate piece 11 having formed thereon the active elements) are horizontally aligned as illustrated in FIG. 10 may be adopted. The semiconductor devices as illustrated in FIGS. 9 and 10 are of the structure in combination of the respective pieces of the semiconductor substrate adopted in the first and second embodiments, and therefore detailed descriptions shall be omitted here. As illustrated in FIGS. 9 and 10, the semiconductor substrate piece (second semiconductor substrate piece 5, 11) formed in the top layer and the first semiconductor substrate 1 are connected not only directly by the Au wires 8, but also indirectly via other piece semiconductor substrate(s).

Alternately, the structure as illustrated in FIG. 11 may be adopted wherein two pieces of semiconductor substrates are laminated so that respective principle surfaces face one another. In this structure, the wiring patterns 22 of the first semiconductor substrate piece 22 and the wiring patterns 24 of the second semiconductor substrate piece 23 (semiconductor substrate mounting piece) are electrically connected via bumps 29. Further, the first semiconductor substrate piece 21 and the third semiconductor substrate piece (semiconductor substrate mounting piece, semiconductor substrate piece in the top layer) 25 having formed thereon wiring patterns 26 are electrically connected via Au wires 8. For the first through third semiconductor substrate pieces 21, 23 and 25 electrically connected in the foregoing manner, signals are input and output through external connection terminals 9. The wiring patterns 22, 24, and 25 include electrode pads (electrodes) 22a, 24a, and 25a, wiring sections 22b, 24b, and 25b, and lands (external connection terminal forming regions) 22c, 24c and 25c respectively.

Next, a method of manufacturing the semiconductor device illustrated in FIG. 11 of the present embodiment will be explained.

As in the second semiconductor substrate pieces 5, 11 adopted in the first and second embodiments, three semiconductor substrates respectively having formed thereon the wiring patterns 6 or the wiring patterns 14 are prepared. These three semiconductor substrates are formed into the first semiconductor substrate piece 21, the second semiconductor substrate piece 23, and the third semiconductor substrate piece 25. Therefore, for convenience in the explanation, semiconductor substrates before dicing which are to be formed into the first semiconductor substrate piece 21, the second semiconductor substrate piece 23, and the third semiconductor substrate 25 are referred to as the first semiconductor substrate, the second substrate and the third substrate respectively.

First, in the lands 22c of the first semiconductor substrate where the wiring patterns 22 are formed, solder balls are mounted using a solder material (Sn:Pb=9:1). Then, the solder balls are melted in the reflow furnace, thereby forming the bumps 29.

Next, the second semiconductor substrate is divided by dicing, and the second semiconductor substrate piece 23 is obtained. Thereafter, using a flip chip bonder which enables chips to be mounted in a face-down disposition, the first semiconductor substrate and the second semiconductor substrate piece 23 are placed so that respective principle surfaces face one another, and the second semiconductor substrate piece 23 is mounted onto the first semiconductor substrate so that the lands 24c of the wiring patterns 24 of second semiconductor substrate piece 23 overlap with the lands 22c of the first semiconductor substrate. Thereafter, the bumps 29 are melted again in the reflow furnace which is maintained in an atmosphere of $N_2$, and the first semiconductor device and the second semiconductor substrate piece are electrically connected.

Next, liquid form resin 27 is injected between the first semiconductor substrate 21 and the second semiconductor substrate piece 23, and is then heated at 150° C. for one hour to be cured. The liquid form resin 27 is provided for preventing the bumps 29 from being deformed or cracking in the subsequent processes due to vibrations or heat to be applied in the subsequent process or heat to be applied when mounting the substrate.

The steps after mounting the third semiconductor device piece 25 are the same as the steps of mounting two semiconductor substrate pieces as explained in the first and second embodiments. The process of forming the third semiconductor substrate piece 25 from the third semiconductor substrate is the same as the process of forming the second semiconductor substrate piece 5 of the first embodiment and the second semiconductor substrate piece 11 of the second embodiment. Therefore, explanations shall be omitted here.

The foregoing semiconductor device as illustrated in FIG. 9 and FIG. 10 can be manufactured by further mounting other semiconductor substrate piece(s) on the second semiconductor substrate piece using the manufacturing methods of a semiconductor device adopted in the first and second embodiments.

In the foregoing manufacturing methods of a semiconductor device adopted in the first through third embodiments, it is preferable to perform a quality test of the first semiconductor substrate before mounting each semiconductor substrate piece on the first semiconductor substrate, so that the semiconductor substrate piece can be mounted on the first semiconductor substrate only in piece regions determined to be of good quality.

According to the foregoing method, a quality test is performed with respect to the first semiconductor substrate before being cut into pieces, and it is therefore possible to selectively use only the piece regions of semiconductor substrate determined to be of good quality. As a result, an improved yield of the semiconductor device can be achieved.

In the foregoing manufacturing methods of a semiconductor device, it is also preferable to perform a quality test on each semiconductor substrate mounting piece before mounting it on said first semiconductor substrate, so that only those determined to be of good quality can be mounted onto said first semiconductor substrate.

According to the foregoing method, a quality test is performed with respect to each semiconductor substrate piece before mounting it onto the first semiconductor substrate, and it is therefore possible to selectively use only the semiconductor substrate pieces determined to be of good quality. As a result, an improved yield of the semiconductor device can be achieved.

The semiconductor device of the present invention may be arranged so as to include a resin sealer for coating conductors, the resin sealer being formed in a dimension of not larger than that of the first semiconductor substrate piece.

According to the foregoing structure, the conductors are coated with the resin sealer, and it is therefore possible to prevent the damages on the conductors. As a result, the reliability of the semiconductor device can be ensured.

The semiconductor device of the present embodiment may be arranged such that the semiconductor substrate mounting piece include electrodes formed on one surface thereof, the surface being aligned in the same direction as the principal surface of the first semiconductor substrate piece, and that the semiconductor substrate mounting piece is amounted so as not to cover the electrodes formed on the first semiconductor substrate piece and the electrodes formed on other semiconductor substrate mounting piece.

According to the foregoing structure, the principal surface of the first semiconductor substrate piece and the surface on electrode forming side of each semiconductor substrate mounting piece are aligned in the same direction. Therefore, each semiconductor substrate piece needs not to have bumps or through-holes for electrically connecting respective pieces of semiconductor substrates.

As a result, the manufacturing process can be simplified, and the manufacturing cost can be reduced.

The semiconductor device of the present invention may be further arranged such that the wiring patterns include external connection terminal forming regions formed on a central portion, the electrodes formed on a peripheral portion, and wiring sections for connecting the external connection terminal forming regions and the electrodes; and an insulating film formed on the wiring patterns has openings formed in areas corresponding to the external connection terminal forming regions and the electrodes.

According to the foregoing structure, the external connection terminals can be connected to the external connection terminal forming regions of the wiring patterns of the semiconductor substrate piece in the top layer through the openings formed in the external connection terminal forming regions of the insulating film. As a result, the manufacturing process can be simplified, and the manufacturing cost can be reduced.

The semiconductor device of the present invention may be further arranged such that at least one of the semiconductor substrate mounting pieces has active elements formed on the surface on the side the electrodes are formed.

According to the foregoing structure, there exists a semiconductor substrate piece having formed thereon the active elements is mounted other than the first semiconductor substrate piece in one package. Namely, a multi-chip one-package semiconductor device wherein a plurality of semiconductor chips are sealed within one package can be realized. With this structure, it is possible to provide active elements in each of mounting semiconductor device pieces by adopting for the semiconductor substrate mounting piece, the same material as that of the substrate (first semiconductor substrate piece) of the semiconductor chip instead of adopting resin material. Further, the semiconductor device of the present invention having the foregoing structure can be formed into the first semiconductor substrate piece size.

As a result, the multi-chip one-package semiconductor device of smaller in size than the conventional semiconductor device can be achieved.

The semiconductor device of the present invention may be arranged such that a plurality of semiconductor substrate pieces are mounted so as to be aligned in the same plane of a top layer.

According to the foregoing structure, for example, in the case of adopting a semiconductor substrate piece of a small dimension for a semiconductor substrate piece having formed thereon active elements in the top layer, by providing another semiconductor substrate piece to be horizontally aligned with the above semiconductor substrate piece, larger external connection terminal forming regions can be obtained.

As a result, sufficient number of external connection terminals can be ensured.

It may be further arranged such that the surface opposite the principal surface of the first semiconductor substrate piece is coated with a resin sealer.

According to the foregoing structure, generation of photoelectromotive force can be suppressed. Namely, an erroneous operation of the semiconductor device due to the effects of light can be surely prevented. As a result, an improved reliability of the semiconductor device can be achieved.

For the material of the first semiconductor substrate piece and the semiconductor substrate mounting pieces, monocrystalline silicon may be adopted.

According to the foregoing structure, by adopting as an interposer an inorganic material such as silicon (Si), which is generally used as a substrate of a semiconductor chip, adverse effects of absorbing water can be suppressed, and the property of shielding light can be ensured. As a result, still improved reliability of the semiconductor device can be achieved.

The manufacturing method of a semiconductor device of the present invention includes the steps of:

(1) forming active elements and electrodes on a principal surface of a first semiconductor substrate;

(2) after forming wiring patterns including electrodes on a mounting semiconductor substrate made of a same material as the first semiconductor substrate, cutting the mounting semiconductor substrate into pieces to obtain semiconductor substrate mounting pieces, the step (2) being performed parallel to the step (1);

(3) mounting at least one semiconductor substrate mounting piece onto the first semiconductor substrate to be fitted within the principal surface of the first semiconductor substrate;

(4) connecting the electrodes formed on the first semiconductor substrate and the electrodes formed on at least one semiconductor substrate mounting piece by means of conductors;

(5) forming external connection terminals on wiring patterns formed on a semiconductor substrate mounting piece in a top layer; and (7) dividing the first semiconductor substrate to obtain semiconductor devices.

According to the foregoing manufacturing method, the semiconductor substrate mounting piece in the top layer can be formed as an interposer. Generally, for an interposer of a semiconductor device, resin (for example, polyimide, glass containing epoxy resin) insulating substrate is adopted. However, when adopting such resin insulating substrate as an interposer, fine wiring patterns are difficult to be formed, or a warpage of a wafer is liable to occur in the manufacturing process due to a difference in the linear thermal expansion coefficients between the insulating substrate and the semiconductor chip.

In contrast, according to the manufacturing method of the present invention, the semiconductor substrate mounting piece formed in the top layer as an interposer is made of a same material as the substrate of the semiconductor chip (first semiconductor substrate). It is therefore possible to manufacture the semiconductor substrate mounting piece using the manufacturing line of semiconductor chips. It is therefore possible to form fine wiring patterns. According to the structure of the present embodiment, it is also possible to form elements which could not be formed when adopting the conventional interposer made of a resin material. Furthermore, by adopting the semiconductor substrate mounting piece in the top layer made of a same material as the first semiconductor substrate, a difference in the linear thermal expansion coefficient between the first semiconductor substrate and the semiconductor substrate mounting piece in the top layer can be eliminated. It is therefore possible to eliminate the problem associated with a warpage of a wafer due to heat applied in the manufacturing process.

Further, by adopting the interposer made of an inorganic material such as silicon (Si) which is generally used for the substrate of the semiconductor chip, an adverse effect of absorbing water can be suppressed, and also the light shielding property can be ensured.

Furthermore, since each mounting semiconductor substrate is arranged so as to be fitted within the size of the first semiconductor substrate piece (first semiconductor substrate piece) obtained by dividing the first semiconductor substrate into pieces, such inconvenience associated with the conventional structure that conductors for connecting electrodes are provided outside the first semiconductor substrate piece can be eliminated.

As a result, the semiconductor device can be reduced in size to the first semiconductor substrate piece size, and in the meantime, a manufacturing cost can be reduced. Furthermore, problems related to the transportation due to a warpage of a wafer occurred in the manufacturing process, or related to the reliability in the connection by the conductors, or changes in quality due to applied heat can be prevented.

The foregoing method of manufacturing a semiconductor device of the present invention may be arranged so as to further include the step of:

(6) forming a resin sealer for coating at least the conductors.

According to the foregoing structure, the conductors are coated with the resin sealer, it is therefore possible to suppress damages on the conductors which possibly occur when dividing the first semiconductor substrate into pieces or when transporting. As a result, the reliability of the semiconductor device can be ensured.

Furthermore, the manufacturing method of a semiconductor device of the present invention may be arranged such that: in the step (3), the surface on the electrode forming side of each semiconductor substrate mounting piece is placed in the direction of the principle surface of the first semiconductor substrate, and each semiconductor substrate mounting piece is mounted so as not to cover the electrodes formed on the first semiconductor substrate and the electrodes provided formed on other semiconductor substrate mounting piece.

According to the foregoing structure, the principal surface of the first semiconductor substrate and the surface on the electrode forming side of each semiconductor substrate mounting piece are aligned in the same direction. Therefore, bumps or through-holes can be omitted from each semiconductor substrate piece for the electrical connection with the first semiconductor substrate.

As a result, the manufacturing process can be simplified, and the manufacturing cost can be reduced.

The manufacturing method of a semiconductor device of the present invention may be arranged such that active elements are formed at least on one of the semiconductor substrate mounting pieces.

According to the foregoing manufacturing method, there exists a semiconductor substrate piece having formed thereon the active elements other than are mounted in a package other than the first semiconductor substrate piece within one package. Namely, a multi-chip one-package semiconductor device wherein a plurality of semiconductor chips are sealed within one package can be realized. According to the structure of the present invention, it is possible to form the active elements on each semiconductor substrate mounting piece by adopting the same material as the substrate (first semiconductor substrate piece) of the semiconductor chip for the semiconductor substrate mounting piece instead of using a resin material. Furthermore, the semiconductor device resulting from the foregoing method can be formed in the first semiconductor substrate piece size.

As a result, the multi-chip one-package semiconductor device of smaller size than the conventional semiconductor device can be achieved.

In the manufacturing method of a semiconductor device of the present invention, it is preferable that wafer process is used in the step (2).

According to the foregoing manufacturing method, finer wires than the wiring patterns formed by printing can be formed. Namely, fine wiring patterns can be formed with ease.

The foregoing manufacturing method of a semiconductor device of the present invention may be arranged such that in the step (3), a quality test is performed on the first semiconductor substrate before mounting each semiconductor substrate mounting piece onto the first semiconductor substrate, so that the semiconductor substrate mounting piece can be mounted on the first semiconductor substrate only in piece regions determined to be of good quality.

According to the foregoing manufacturing method, by performing a quality test on the first semiconductor substrate before being cut into pieces, the piece regions of the first semiconductor substrate determined to be of good quality can be selectively used.

As a result, an improved yield of the semiconductor device can be achieved.

The foregoing manufacturing method of a semiconductor device of the present invention may be arranged such that in the step (3), a quality test is performed on each semiconductor substrate mounting piece before mounting it on the first semiconductor substrate, so that only those determined to be of good quality are mounted onto the first semiconductor substrate.

According to the foregoing manufacturing method, by performing a quality test on each mounting semiconductor piece before mounting it to the first semiconductor substrate, only those determined to be of good quality can be selectively used.

As a result, an improved yield of the semiconductor device can be achieved.

The foregoing manufacturing method of a semiconductor device of the present invention may be arranged such that:

in the step (3), each mounting semiconductor piece is mounted onto the first semiconductor substrate using a sheet-like die attaching material.

According to the foregoing manufacturing method, by mounting each semiconductor substrate mounting piece onto the first semiconductor substrate using a sheet-like die-attaching material, problems when adopting the pasted die-attaching material can be prevented, i.e., when applying it to the semiconductor substrate piece, the semiconductor substrate piece is damaged by an application-use needle, or the pasted die-attaching material flows into the electrodes.

As a result, an improved yield of the semiconductor device can be achieved.

The foregoing manufacturing method of a semiconductor device of the present invention may be arranged so as to include the step of:

polishing the back surface of the first semiconductor substrate after performing the step (6).

According to the foregoing method, the first semiconductor is made thinner as being polished. It is therefore possible to suppress an increase in height resulting from laminating another semiconductor substrate mounting piece on the first semiconductor substrate.

As a result, an increase in overall increase in size of the semiconductor device can be suppressed.

The foregoing manufacturing method of a semiconductor device of the present invention may be arranged such that:

in the step (6), the resin sealer is formed by curing liquid form resin.

According to the foregoing structure, by adopting liquid form resin as the resin sealer, molds for sealing resin can be omitted. As a result, it becomes applicable to semiconductor chips of various sizes.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A semiconductor device, comprising:

a first semiconductor substrate piece having active elements and electrodes formed on its principal surface;

at least one semiconductor substrate mounting piece made of a same material as said first semiconductor substrate piece, said mounting semiconductor substrate being mounted on the principle surface side of said first semiconductor substrate piece within a dimension of said first semiconductor substrate piece, to be fitted within the principal surface, wiring patterns including electrodes, formed on a surface of a semiconductor substrate mounting piece in a top layer of said at least one semiconductor substrate mounting piece;

external connection terminals formed on said wiring patterns; and conductors for connecting the electrodes formed on said first semiconductor substrate piece and the electrodes formed on said semiconductor substrate mounting piece in the top layer.

2. The semiconductor device as set forth in claim 1, further comprising:

a resin sealer for coating said conductors, said resin sealer being formed in a dimension of not larger than that of said first semiconductor substrate piece.

3. The semiconductor device as set forth in claim 1, wherein:

said semiconductor substrate mounting piece includes electrodes formed on one surface thereof, the surface being aligned in a same direction as the principal surface of said first semiconductor substrate piece, said semiconductor substrate mounting piece is mounted so as not to cover the electrodes formed on said first semiconductor substrate piece and the electrodes formed on other semiconductor substrate mounting piece.

4. The semiconductor device as set forth in claim 1, wherein:

said wiring patterns include external connection terminal forming regions formed on a central portion, electrodes formed on a peripheral portion and wiring sections for connecting the external connection terminal forming regions and the electrodes, said semiconductor device further comprising:

an insulating film formed on said wiring patterns, said insulating film having openings formed in areas corresponding to the external connection terminal forming regions and the electrodes.

5. The semiconductor device as set forth in claim 1, wherein:

at least one of said semiconductor substrate mounting piece has active elements formed on the surface on the electrode forming side.

6. The semiconductor device as set forth in claim 1, wherein:

said semiconductor substrate mounting piece in the top layer includes a plurality of semiconductor substrate mounting pieces which are horizontally aligned in a same plane.

7. The semiconductor device as set forth in claim 1, wherein:

a surface of said first semiconductor substrate piece opposite the principal surface is coated with a resin sealer.

8. The semiconductor device as set forth in claim 1, wherein:

said first semiconductor substrate piece and said semiconductor substrate mounting piece are made of monocrystalline silicon.

9. The semiconductor device as set forth in claim 4, wherein:

said insulating film is made of polyimide.

* * * * *